(12) United States Patent
Kikuchi

(10) Patent No.: US 9,767,859 B2
(45) Date of Patent: Sep. 19, 2017

(54) PRINTED CIRCUIT BOARD AND PRINTED WIRING BOARD

(71) Applicant: CANON KABUSHIKI KAISHA, Tokyo (JP)

(72) Inventor: Masanori Kikuchi, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 82 days.

(21) Appl. No.: 14/684,156

(22) Filed: Apr. 10, 2015

(65) Prior Publication Data

US 2015/0294712 A1    Oct. 15, 2015

(30) Foreign Application Priority Data

Apr. 14, 2014  (JP) .................. 2014-082814

(51) Int. Cl.
*H05K 1/00* (2006.01)
*G11C 5/06* (2006.01)

(52) U.S. Cl.
CPC ..................... *G11C 5/063* (2013.01)

(58) Field of Classification Search
CPC ...................................... G11C 5/063
See application file for complete search history.

(56) References Cited

U.S. PATENT DOCUMENTS

| | | | | |
|---|---|---|---|---|
| 9,520,160 | B2* | 12/2016 | Yoon | G11C 5/06 |
| 2007/0126462 | A1* | 6/2007 | Ryu | G11C 5/04 |
| | | | | 326/30 |
| 2007/0194968 | A1* | 8/2007 | Sung | G11C 5/04 |
| | | | | 341/154 |
| 2009/0086522 | A1* | 4/2009 | Hiraishi | G11C 5/04 |
| | | | | 365/63 |

FOREIGN PATENT DOCUMENTS

JP    2009-086841 A    4/2009

OTHER PUBLICATIONS

"PC3-6400/PC3-8500/PC3-10600/PC3-12800/PC3-14900/PC3-17000 DDR3 Unbuffered SO-DIMM Reference Design Specification"; JEDEC Standard No. 21C pp. 1-76; Revision 2.0, Dec. 2010.

* cited by examiner

Primary Examiner — Yuriy Semenenko
(74) Attorney, Agent, or Firm — Canon U.S.A. Inc., IP Division

(57) ABSTRACT

A first reception circuit and a second reception circuit are mounted on a printed circuit board, and receive signals via wiring thereof from a transmission circuit. The printed wiring board includes a trunk wiring, a first branched line branching from a first branch connection point, and a second branched line branching from a second branch connection point in order. A wiring area between the start end and the first branch connection point is divided into a first wiring portion and a second wiring portion, in order from the start end, and a wiring area between the first branch connection point and the second branch connection point is a third wiring portion. The characteristic impedance of the first wiring portion is set to equal or lower than the characteristic impedance of the third wiring portion, and the characteristic impedance of the second wiring portion is set higher than the characteristic impedance of the first wiring portion.

18 Claims, 12 Drawing Sheets

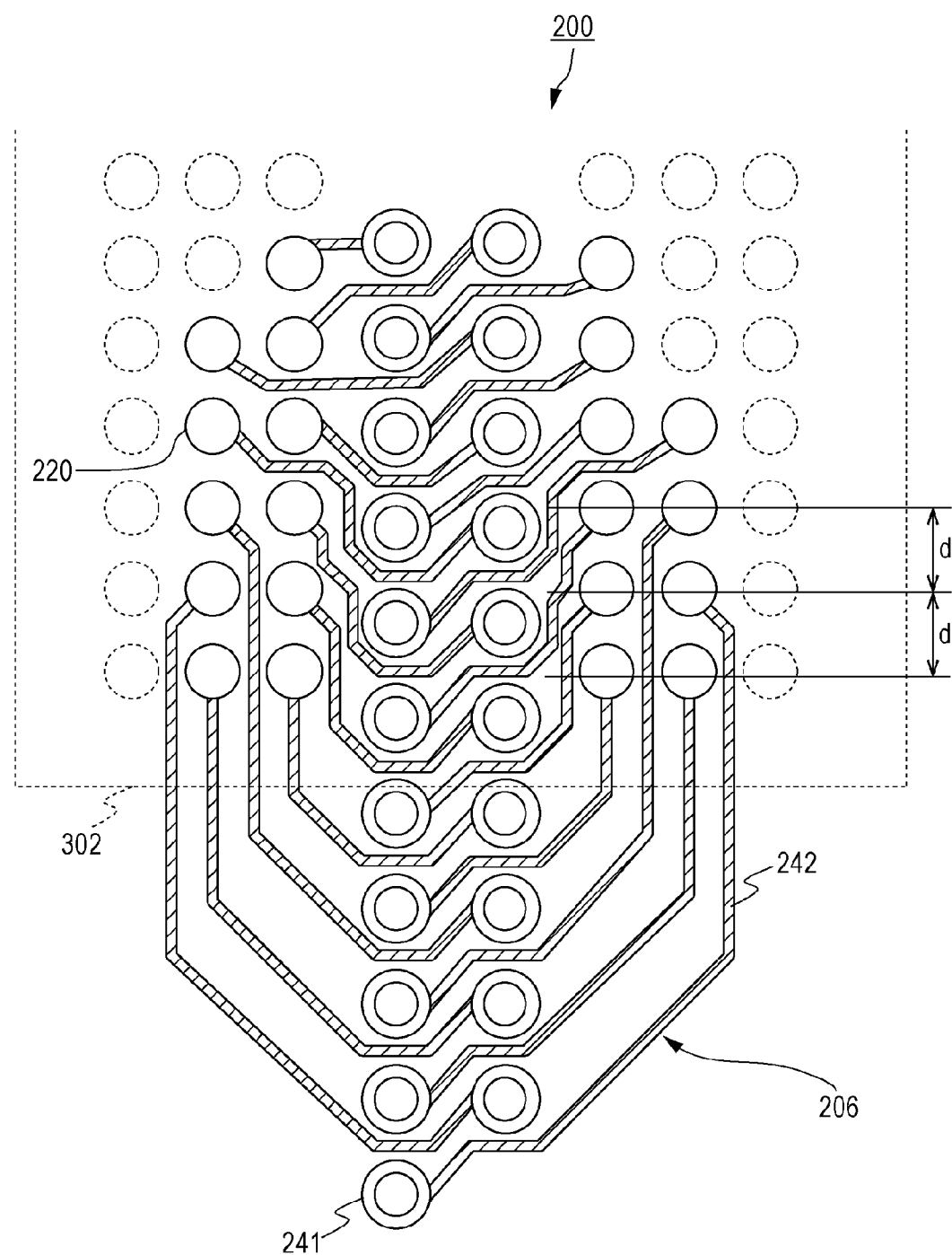

PRINTED CIRCUIT BOARD AND PRINTED WIRING BOARD

BACKGROUND OF THE INVENTION

Field of the Invention

The present invention relates to a printed circuit board and a printed wiring board, where a receiving circuit is electrically connected to a trunk wiring by branch wiring.

Description of the Related Art

Generally, a memory system is configured including a memory controller and multiple memory devices. Examples of commonly known memory devices include Double Data Rate 3 Synchronous Dynamic Random Access Memory (DDR3-SDRAM).

A memory device may be mounted on a mother board, or may be mounted on a module board. In a case where a memory device is mounted on a module board, a memory system is configured by the memory device being connected to the motherboard to which a memory controller has been mounted.

A memory controller transmits an address signal or command signal (address/command signal), and each memory device is controlled by receiving an address/command signal, with data signals being exchanged between the memory controller and multiple memory devices. Particularly high-functionality electronic devices often use DDR3-SDRAM to secure memory space.

The memory device DDR3-SDRAM has built in a function to adjust signal transmission timing. Each memory device is connected to a so-called "fly-by" trunk wiring where high-speed address/command signals are enabled (see JEDEC standard No. 21C PC3-6400/PC3-8500/PC3-10600/PC3-12800/PC3-14900/PC3-17000 DDR3 Unbuffered SO-DIMM Reference Design Specification Revision 2.0). In this JEDEC standard, the trunk wiring uses two inner layers of the printed wiring board. Also, a ball grid array (BGA) type semiconductor package is used for the memory device in the JEDEC standard. The printed wiring board has formed thereupon vias formed on the trunk wiring to make up branched wiring branching from the trunk wiring to the memory device, mounting pads connected to reception terminals of the BGA type semiconductor package, and leading wiring connecting the vias and mounting pads. The length of the branched wiring to the memory device can be reduced by using small-diameter vias, which can be disposed between mounting pads, for part of the branched wiring.

On the other hand, Japanese Patent Laid-Open No. 2009-86841 proposes reduction in waveform ringing by adjusting the length of the branched wiring on a dual inline memory module (DIMM), in a case of a DIMM having a DDR3-SDRAM mounted to a module board.

However, the length of the branched wiring is set to be short in the above Japanese Patent Laid-Open No. 2009-86841 and the JEDEC standard, around 3 to 5 mm, in accordance with the DIMM standard. Accordingly, the length of the leading wiring has been reduced in the related art by situating the vias adjacent to the mounting pads, thus reducing the length of the branched wiring. However, in the case of wiring of which the number of lines is great, and mounting pads are disposed in high density, such as address/command wiring or the like, vias cannot be disposed between the mounting pads, and may be disposed on the outer side of a mounting pad group. In such a case, the branched wiring will be longer. The longer the branched wiring is, the larger the problem of signal attenuation and reflection becomes, and can lead to disturbance in signal waveforms, i.e., ringing in the signals. Particularly problematic in address/command signal waveforms in DDR3-SDRAMs is that there are cases where signal ringing is large to where input voltage conditions for the signals cannot be satisfied.

It has been found desirable to provide a printed circuit board and a printed wiring board capable or reducing ringing in the waveforms of signals received at a first reception circuit.

SUMMARY OF THE INVENTION

A printed circuit board includes a printed wiring board, and a first reception circuit and a second reception circuit, mounted on the printed wiring board, that receive signals transmitted from a transmission circuit via wiring of the printed wiring board. The printed wiring board has formed thereupon a trunk wiring, of which a start end is electrically connected to the transmission circuit, a first branched line of which one end is electrically connected to a first branch connection point on the trunk wiring, and the other end is electrically connected to the first reception circuit, and a second branched line of which one end is electrically connected to a second branch connection point on the trunk wiring that is farther from the start end than the first branch connection point, and the other end is electrically connected to the second reception circuit. A wiring area between the start end and the first branch connection point of the trunk wiring is divided into a first wiring portion and a second wiring portion, in order from the start end. A wiring area between the first branch connection point and the second branch connection point is a third wiring portion, the characteristic impedance of the first wiring portion is set to equal or lower than the characteristic impedance of the third wiring portion, and the characteristic impedance of the second wiring portion is set higher than the characteristic impedance of the first wiring portion.

Further features of the present invention will become apparent from the following description of exemplary embodiments with reference to the attached drawings.

BRIEF DESCRIPTION OF THE DRAWINGS

FIG. 2 is a plan view of a motherboard around where a memory device is mounted.

DESCRIPTION OF THE EMBODIMENTS

Embodiments to carry out the present invention will be described in detail with reference to the drawings.

First Embodiment

Figure 1:
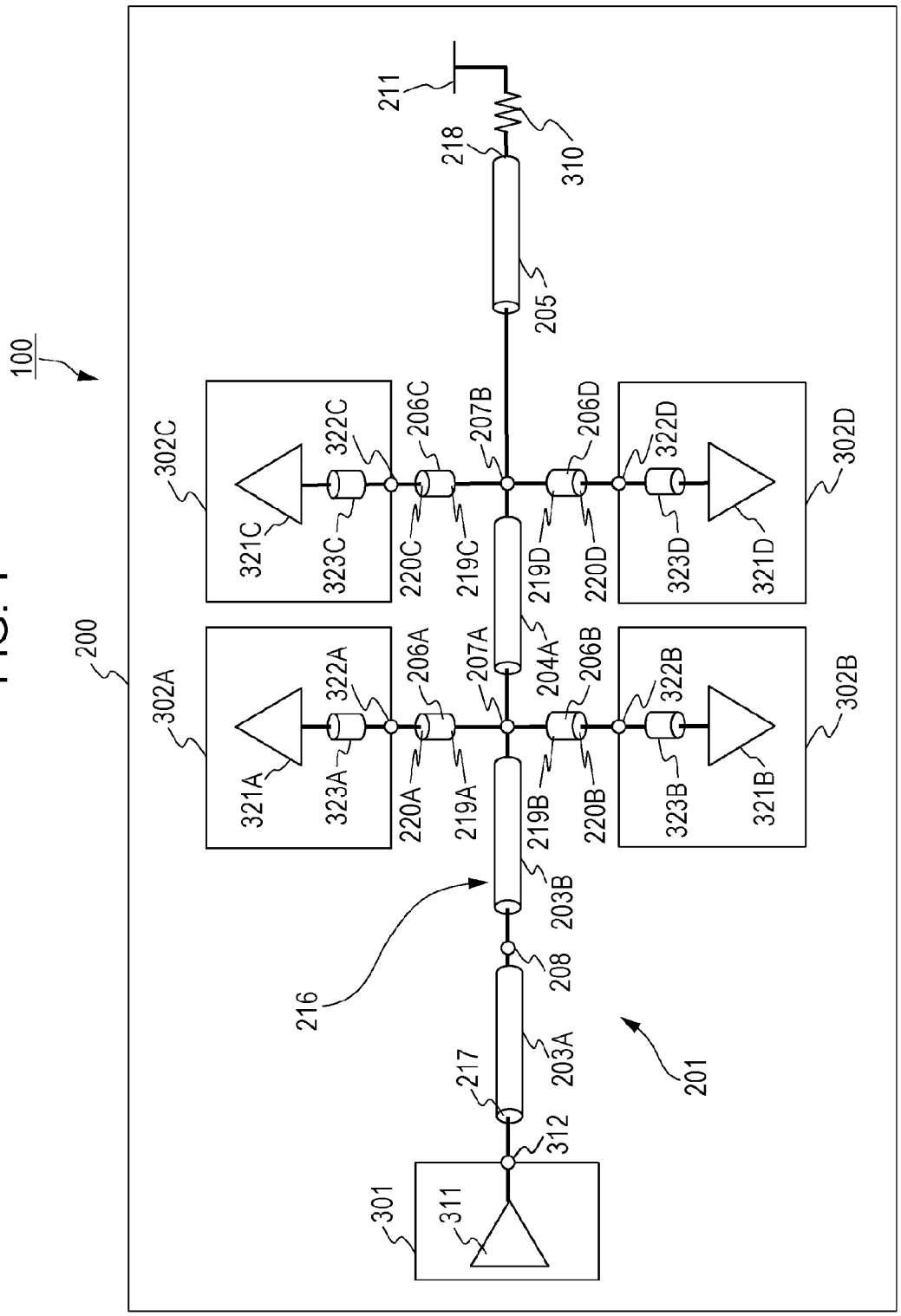
FIG. 1 is a topology diagram illustrating a wiring configuration of a memory system, as an example of a printed circuit board according to a first embodiment.

FIG. 1 is a topology diagram illustrating a wiring configuration of a memory system, as an example of a printed circuit board according to a first embodiment. The memory system 100, serving as an example of a printed circuit board according to the first embodiment of the present invention includes a motherboard 200 which is a printed wiring board, a memory controller 301 which is a transmission circuit, and multiple memory devices 302A through 302D, which are multiple reception circuits. The memory devices 302A through 302D in the first embodiment are DDR3-SDRAMs. The memory controller 301 and the multiple memory devices 302A through 302D are mounted to the motherboard 200. In detail, the memory controller 301 is mounted to one of the front face and rear face of the motherboard 200. The memory devices 302A and 302C are mounted on the front face, and the memory devices 302B and 302D are mounted on the rear face. Note that the front face and rear face are relative terms. The front face may be also referred to as "one face" or "first face", and the rear face on the opposite side form the front face may be referred to as "other face" or "second face". The front face of the motherboard 200 may also be referred to as front layer, and the rear face as rear layer. An inner layer (conductive layer) is disposed between the front layer (conductive layer) and rear layer (conductive layer), across insulator layers. The conductive layers are layer where conductive patterns are disposed.

The memory controller 301 controls the memory devices 302A through 302D. The memory controller 301 transmits signals to the memory devices 302A through 302D, address/command signals in the first embodiment, via the motherboard 200.

The memory devices 302A through 302D receive the address/command signals transmitted from the memory controller 301 via the motherboard 200. The memory controller 301 and the memory devices 302A through 302D then perform transmission/reception of data signals.

The bus lines for address signals and the bus lines for command signals have a fly-by wiring configuration in the first embodiment. One bus line 201 of the multiple bus lines is illustrated in FIG. 1.

The memory controller 301 is a semiconductor package having a transmission chip 311 made up of a semiconductor chip which is a transmission element, and a transmission terminal 312 connected to the transmission chip 311. The memory devices 302A through 302D are semiconductor packages having memory cells 321A through 321D made up of semiconductor chips which are reception elements, and reception terminals 322A through 322D which are connected to the memory cells 321A through 321D via internal lines 323A through 323D. The internal lines 323A through 323D are the effective wiring of the memory devices 302A through 302D. The memory devices 302A through 302D each are semiconductor packages of the same configuration and same properties.

The motherboard 200 has the bus line 201 which connects the memory controller 301 (transmission element) and the memory devices 302A through 302D (reception elements) by fly-by routing.

The bus line 201 has a start end 217 electrically connected to the transmission terminal 312 of the memory controller 301, and a trunk wiring 216 where a termination 218 is electrically connected to one end of a termination resistance (terminator) 310. The transmission terminal 312 and the start end 217 in FIG. 1 are listed at being different locations for sake of convenience, but in reality indicate the same position. The trunk wiring 216 is formed by fly-by routing in the wire direction from the start end 217 to the termination 218. The other end of the termination resistance 310 is electrically connected to a termination line 211 where termination voltage is applied. Accordingly, the start end 217 of the trunk wiring 216 is electrically connected to the memory controller 301, and the termination 218 is electrically connected to the termination resistance (terminator) 310, so reflection of signals at the termination 218 is suppressed by the termination resistance 310.

The bus line 201 also has branch lines 206A and 206B which electrically connect reception terminals 322A and 322B of the memory devices 302A and 302B to a branch connection point 207A. The bus line 201 further has branch lines 206C and 206D which electrically connect reception terminals 322C and 322D of the memory devices 302C and 302D to a branch connection point 207B which is different from the branch connection point 207A.

To describe this in detail, one end 219A in the line direction of the branch line 206A and one end 219B in the line direction of the branch line 206B are electrically connected to the branch connection point 207A. In the same way, one end 219C in the line direction of the branch line 206C and one end 219D in the line direction of the branch line 206D are electrically connected to the branch connection point 207B. Also, the other ends 220A through 220D of the branch lines 206A through 206D in the wiring direction are electrically connected to reception terminals 322A through 322D of the memory devices 302A through 302D. While the one end 219A of the branch line 206A and the one end 219B of the branch line 206B and the branch connection point 207A, are illustrated as being different position in FIG. 1 for the sake of convenience, in reality these indicate the same position. In the same way, while the one end 219C of the branch line 206C and the one end 219D of the branch line 206D and the and the branch connection point 207B, are illustrated as being different position in FIG. 1 for the sake of convenience, in reality these indicate the same position. The memory devices 302A and 302B are first reception circuits, and the memory devices 302C and 302D are second reception circuits in the first embodiment. That is to say, there are multiple (e.g., two) first reception circuits and multiple (e.g., two) second reception circuits in the first embodiment.

While description will be made in the first embodiment regarding a case where there are multiple first and second reception circuits, but the number thereof may be one instead. While description will be made in the first embodiment regarding a case where the memory device 302A serving as the first reception circuit mounted on the front face is one, the number thereof may be multiple. Similarly, while description will be made regarding a case where the memory device 302B serving as the first reception circuit mounted on the rear face is one, the number thereof may be multiple. Similarly, while description will be made regarding a case where the memory device 302C serving as the second reception circuit mounted on the front face is one, the number thereof may be multiple. Similarly, while description will be made regarding a case where the memory device 302D serving as the second reception circuit mounted on the rear face is one, the number thereof may be multiple.

Now, the branch connection point 207A is a first branch connection point, and the branch connection point 207B is a second branch connection point that is farther from the start end 217 of the trunk wiring 216 than the branch connection point 207A. The branch lines 206A and 206B are first branch lines, and the branch lines 206C and 206D are second branch lines. The branch lines 206A through 206D are set to have the same line length (length in the line direction).

From the start end 217 to the first branch connection point 207A on the trunk wiring 216 in the first embodiment are disposed a first wiring portion 203A and a second wiring portion 203B which have different characteristic impedances from each other, in that order from the start end 217. A point serving as a boundary portion between the first wiring portion 203A and the second wiring portion 203B is referred to as connection point 208 for sake of convenience.

That is to say, the wiring portion between the start end 217 and the connection point 208 is the first wiring portion 203A, and the wiring portion between the connection point 208 and the branch connection point 207A is the second wiring portion 203B.

The trunk wiring 216 further has a wiring portion (third wiring portion) 204A between the branch connection point 207A and the branch connection point 207B, and a wiring portion 205 between the branch connection point 207B and the termination 218. The characteristic impedance of the wiring portion 203B is set to be higher than the characteristic impedance of the wiring portion 203A in the first embodiment. The characteristic impedance of the wiring portion 203A is set so as to be the same or lower than the characteristic impedance of the wiring portion 204A at this time.

The length of the wiring portion 203A and the length of the wiring portion 203B are the same as or longer than the length of the wiring portion 204A, and configured so as to be shorter than a line length obtained by adding the effective branch line length at the branch line 206C (206D) to the wiring portion 204A.

The effective branch line length at the branch line 206C (206D) here is the line length obtained by totaling the length of the branch line 206C (206D) and the effective line length of the effective line 323C (323D) within the memory device 302C (206D).

The above-described wiring structure for the trunk wiring 216 suppresses ringing of signals received at the memory device 302A (302B).

The trunk wiring 216 according to the first embodiment is formed at the inner layer or the front/rear layers of the motherboard 200. The branch lines 206A and 206C are formed straddling the inner layer and front layer of the motherboard 200. The branch lines 206B and 206D are formed straddling the inner layer and rear layer of the motherboard 200. The memory devices 302A through 302D are BGA semiconductor packages, with the memory devices 302A and 302C mounted on the front layer of the motherboard 200 and the memory devices 302B and 302D mounted on the rear layer of the motherboard 200.

FIG. 2 is a plan view of a motherboard, around where a memory device is mounted. FIG. 2 illustrates the memory devices 302A through 302D as a memory device 302, and the branch lines 206A through 206D as branch lines 206, representatively illustrating one memory device 302.

Multiple (21) branch lines 206 are illustrated in FIG. 2, electrically connected to each of multiple (21) trunk wirings 216, formed at the inner layer and omitted from illustration in FIG. 2. Also omitted from illustration is an array of multiple reception terminals 322 provided on the bottom face of the memory device 302. The branch line 206 includes a via 241 electrically connected to the trunk wiring 216, a mounting pad 220 which is the other end of the branch line 206, formed on the front layer (or rear layer), and a leading wiring pattern 242 which electrically connect the via 241 and the mounting pad 220. The multiple mounting pads 220 are disposed in an array. The mounting pads 220 are each electrically connected to a reception terminal 322 of the memory device 302 by a connecting conductor such as a solder ball or the like, omitted from illustration.

The vias 241 are disposed on the outer side of the mounting pad group made up of these multiple mounting pads 220, and can be formed with a relatively large diameter, thereby realizing an inexpensive motherboard 200. The pitch d of the mounting pads 220 is 0.8 mm, for example. The length of the branch line 206 in this case is maximally around 10 mm.

In a case where branching is on one face, there are no branched lines or memory device on the rear face side immediately below, but in a case where branching is on both faces, branched lines are configured on the unshown rear face side as well, and a memory device is connected.

A comparative example will be described here, where the characteristic impedance of the wiring portion 203A and the characteristic impedance $Z_1$ of the wiring portion 203B are the same on the motherboard 200 according to the first embodiment.

Figure 12:
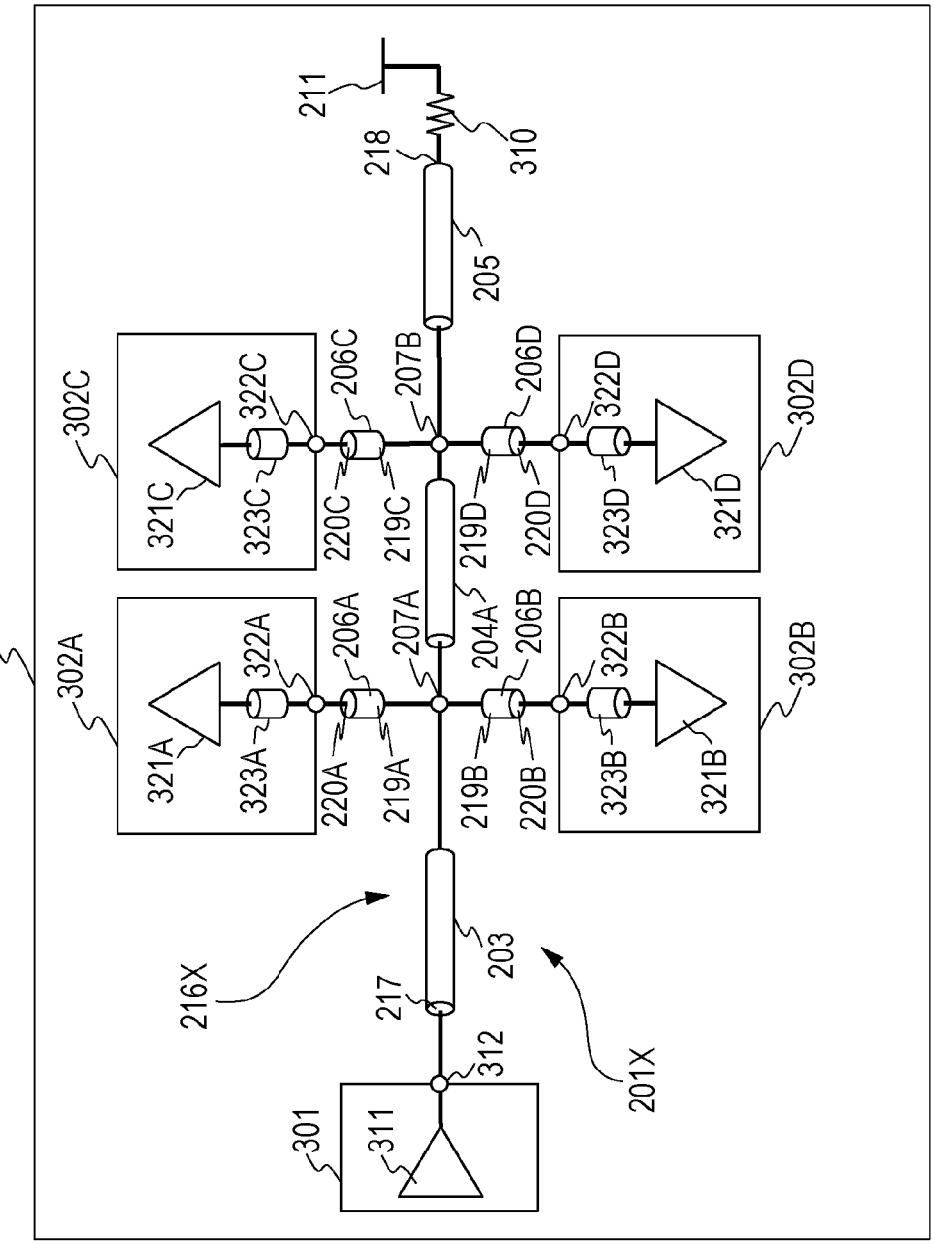
FIG. 12 is a topology diagram illustrating a wiring configuration of a memory system, as an example of a printed circuit board according to a comparative embodiment.

FIG. 12 is a topology diagram illustrating a wiring configuration of a memory system 100X, as an example of a printed circuit board according to a comparative embodiment. Note that the memory system 100X illustrated in FIG. 12 has a motherboard 200X, the motherboard 200X has a bus line 201X, and the bus line 201X has a trunk wiring 216X. From the start end 217 of the trunk wiring 216X to the first branch connection point 207A in FIG. 12 is the wiring portion 203A, and the characteristic impedance of the wiring portion 203A is constant. Other configurations are the same as with the first embodiment.

The longer the branch lines 206A through 206D become, the greater the problem of signal attenuation and reflection becomes, contributing to disturbance in signal waveforms. What is problematic in the waveform of address/command signals with DDR3-SDRAM in particular is that there are cases where the ringing of signals becomes great to where the signal input voltage conditions cannot be satisfied.

The size of lands for vias 241 which can be used in the inexpensive motherboard 200 illustrated in FIG. 2 is around 0.6 mm in diameter, and the size of the mounting pads 220 is around 0.4 mm in diameter. Accordingly, the vias 241 cannot be placed between the mounting pads 220 at a 0.8 mm pitch, so the vias 241 are arrayed on the outer side of the memory device 302. As a result, the above-described problem of waveforms on the signal input voltage conditions readily occurs, due to the leading wiring pattern 242 from the vias 241 to the mounting pads 220 being longer.

Also, propagation delay to the memory cell 321 exists within the memory device 302 due to package wiring and internal capacitance. This propagation delay, when converted into length on the printed wiring board is the effective wiring length of the internal lines 323. The branched wiring length including this effective internal line 323 length, i.e., the total length of the internal wiring 323 and branched wiring 206, normally has variation of 10 to 20 mm, and should be considered to be even wider when taking into consideration difference among memory vendors and generations. AS described above, the total line length of the internal lines 323 and branch lines 206 is the effective branched wiring length. The effective branched wiring length should be given consideration of around 25 to 30 mm.

Figure 6A:
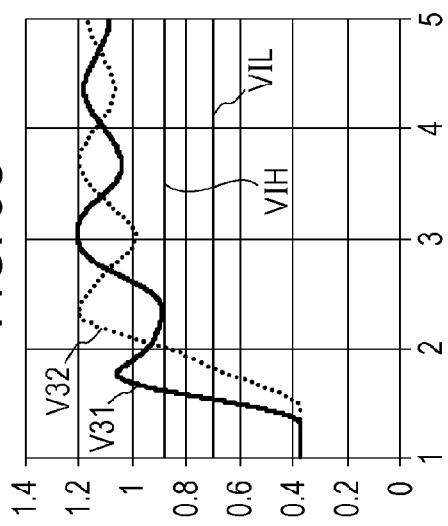
FIGS. 6A through 6F are waveform diagrams illustrating signals which memory devices receive in memory systems according to a first example and a comparative example.
Figure 6B:
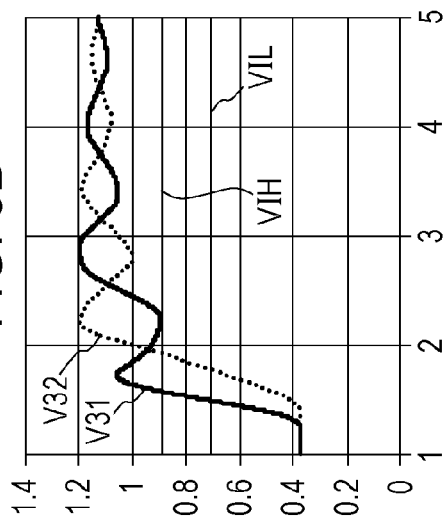
Figure 6C:
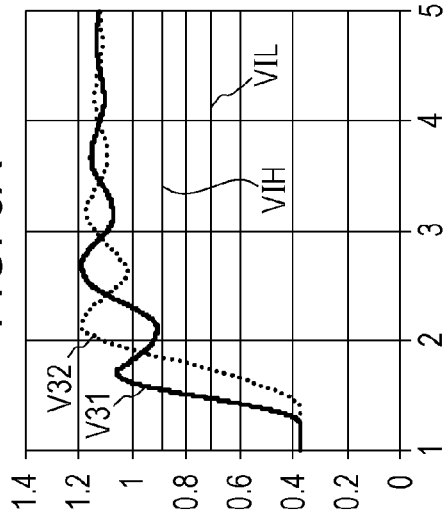

FIGS. 6A through 6F are waveform diagrams illustrating signals which the memory device 302A of the memory systems according to the first embodiment and the comparative example receives. FIGS. 6A through 6C are waveform diagrams illustrating difference in effective branched wiring in the memory system 100X according to the comparative example. FIG. 6A illustrates a waveform in a case where the effective branched wiring length is 20 mm, FIG. 6B illustrates a waveform in a case where the effective branched wiring length is 25 mm, and FIG. 6C illustrates a waveform in a case where the effective branched wiring length is 30 mm. The signal voltage in the memory device 302A is denoted by V31, and the signal voltage in the memory device 302C is denoted by V32. The waveforms of signals received by the memory devices 302B and 302D are the same as those of the memory devices 302A and 302C, and accordingly will be omitted here.

The longer the total line length of the internal line 323A and branch line 206A is, the larger the ringing of the signal waveform is. This ringing may further be increased due to the effects of noise such as crosstalk, so a voltage difference as far removed from the threshold voltage as possible is necessary in design.

Of the voltages received by the memory devices 302A and 302C, the voltage V31 received by the memory device 302A does not satisfy the input voltage conditions, as illustrated in FIGS. 6B and 6C. The threshold voltages VIL and VIH have magnitude of the signal input voltage conditions, and normally have voltage difference of 200 mV. When the signal voltage is higher than the voltage VIH, the logical value is "high", and when the signal voltage is lower than the voltage VIL, the logical value is "low". However, when voltage of signals between the voltage VIH and voltage VIL accumulates, the logical value becomes unstable. Accordingly, signals which have exceeded the input voltage conditions at one point, at the time of the signals changing, entering between the voltage VIH and voltage VIL due to ringing again is problematic from an operational perspective.

It has been found that the primary reason of ringing occurring in the signal waveform reaching the memory device 302A is negative reflection from the branch connection point 207B of the trunk wiring 216X. The cause thereof will be described in detail below.

Figure 3A:
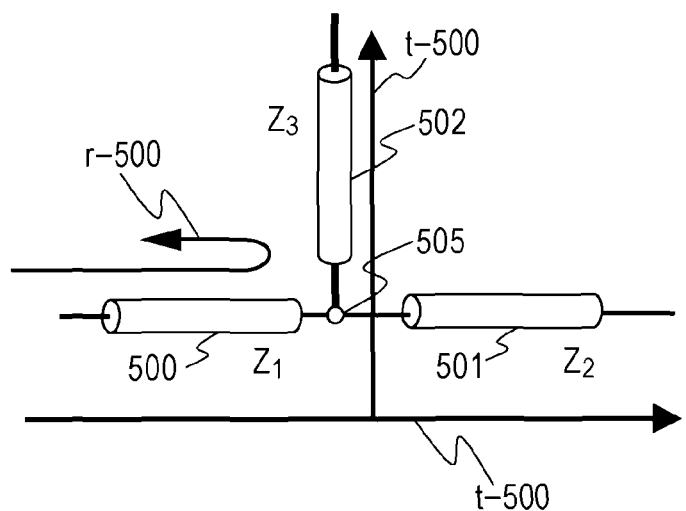
FIGS. 3A and 3B are diagrams for describing reflection and transmission of signal components at branch connection locations.
Figure 3B:
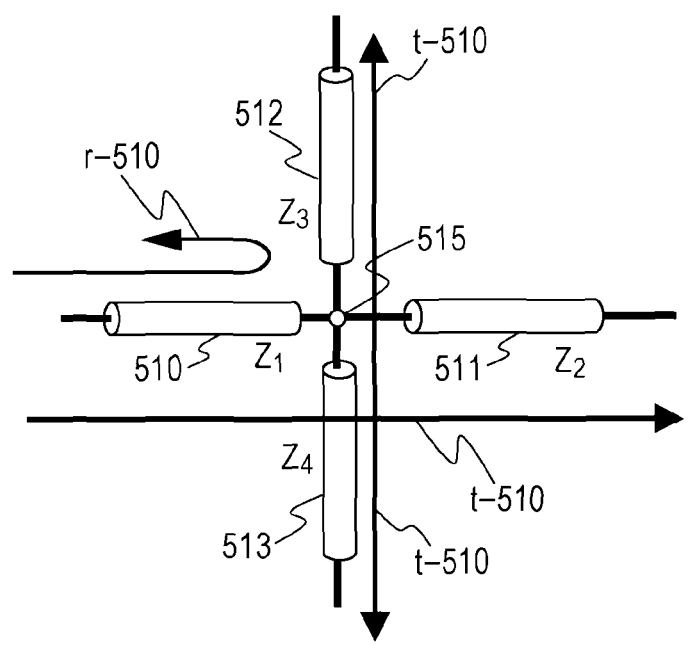

FIGS. 3A and 3B are diagrams for describing reflection and transmission of signal components at branch connection points. FIG. 3A illustrates a line 500 having a characteristic impedance $Z_1$, a line 501 having a characteristic impedance $Z_2$, and a line 502 having a characteristic impedance $Z_3$, connected by the connection point 505. Assumption will be made that signals are conveyed from the line 500 side. FIG. 3A illustrates a path r-500 where signals from the line 500 side are reflected at the connection point 505 and return, and a path t-500 where signals are transmitted through the connection point 505 and conveyed to the lines 501 and 502.

The composite impedance $Z_a$ of the line 501 and line 502 as seen from the line 500 side is as shown in the following Expression (1).

$$Z_a = \frac{Z_2 \times Z_3}{Z_2 + Z_3} \tag{1}$$

For example, in a case where the characteristic impedance $Z_2$ and the characteristic impedance $Z_3$ are each 50Ω, the composite impedance $Z_a$ is 25Ω.

The voltage ratio at which signals conveyed from the line 500 side are reflected at the connection point 505 is shown in the following Expression (2).

$$\frac{Z_a - Z_3}{Z_a + Z_1} \tag{2}$$

In a case where the characteristic impedance $Z_1$ is 50Ω, and the composite impedance $Z_a$ is 25Ω, for example, the value in Expression (2) is −⅓, meaning that −⅓ of the voltage signal is reflected. The ratio of voltage conveyed from the line 500 side which transmits the connection point 505 is shown in the following Expression (3).

$$\frac{2Z_a}{Z_a + Z_3} \tag{3}$$

In a case where the characteristic impedance $Z_1$ is 50Ω, and the composite impedance $Z_a$ is 25Ω, for example, the value in Expression (2) is ⅔, meaning that ⅔ of the voltage is transmitted.

FIG. 3B illustrates a line 510 having characteristic impedance $Z_1$, a line 511 having characteristic impedance $Z_2$, a line 512 having characteristic impedance $Z_3$, and a line 513 having characteristic impedance $Z_4$, connected at the connection point 515. Assumption will be made that signals are conveyed from the line 510 side. FIG. 3B illustrates a path r-510 where signals from the line 510 side are reflected at the connection point 515 and return, and a path t-510 where signals are transmitted through the connection point 515 and conveyed to the lines 511, 512, and 513.

The composite impedance $Z_a$ of the of the line 511 and line 512 as seen from the line 510 side is as shown in the following Expression (4).

$$Z_a = \frac{Z_2 \times Z_3 \times Z_4}{Z_2 \times Z_3 + Z_2 \times Z_4 + Z_3 \times Z_4} \tag{4}$$

For example, in a case where the characteristic impedance $Z_2$ and the characteristic impedance $Z_3$ are each 50Ω, the composite impedance $Z_a$ is 17Ω.

The ratio at which signals conveyed from the line 510 side are reflected at the connection point 515 is shown in the above Expression (2). In a case where the characteristic impedance $Z_1$ is 50Ω, and the composite impedance $Z_a$ is 17Ω, for example, the value in Expression (2) is −½, meaning that −½ of the voltage is reflected.

The ratio of voltage conveyed from the line 510 side which transmits the connection point 515 is shown in the above Expression (3). In a case where the characteristic impedance $Z_1$ is 50Ω, and the composite impedance $Z_a$ is 17Ω, for example, the value in Expression (3) is ½, meaning that ½ of the voltage is transmitted.

Figure 4A:
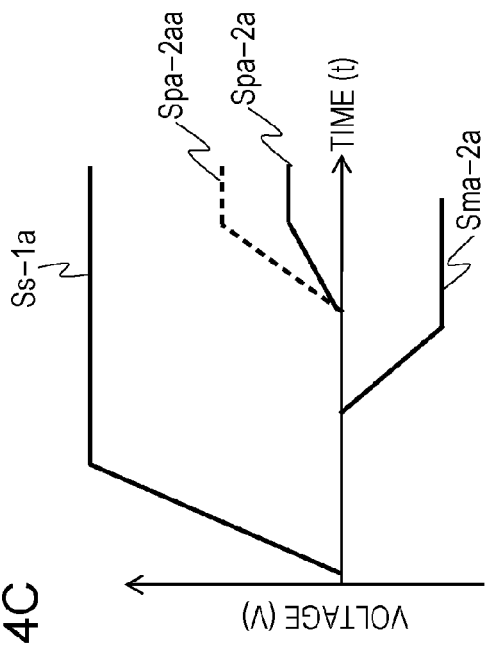
FIGS. 4A through 4D are diagrams for describing waveforms of signals in a memory system according to a comparative example.

FIGS. 4A through 4D are diagrams for describing the waveforms of signals in the memory system 100X according to the comparative example illustrated in FIG. 12. FIG. 4A is a topology diagram for describing a signal path s-1a connecting directly to the memory cell 321A of the memory device 302A, and a reflection path ma-2a from the branch connection point 207B.

The signal path s-1a of signal waves connecting from the transmission chip 311 of the memory controller 301 is a path which passes through the lines 203, 206A, and 323A, and reaches the memory cell 321A. The reflection path ma-2a is a path which passes through the lines 203 and 204A, turns back at the branch connection point 207B, passes through the lines 204A, 206A, 323A, and reaches the memory cell 321A.

Figure 4C:
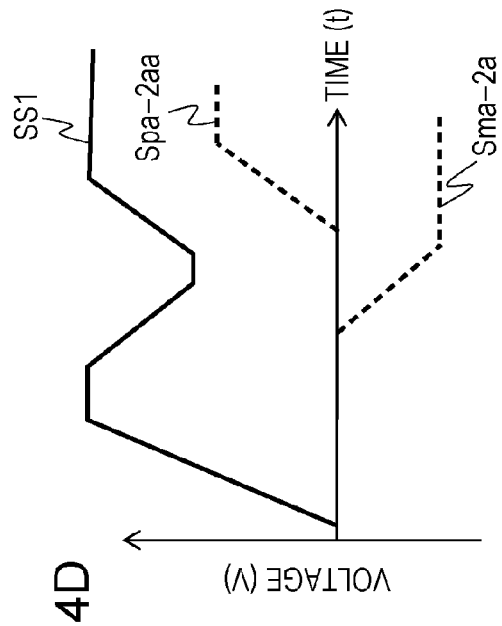
Figure 4B:
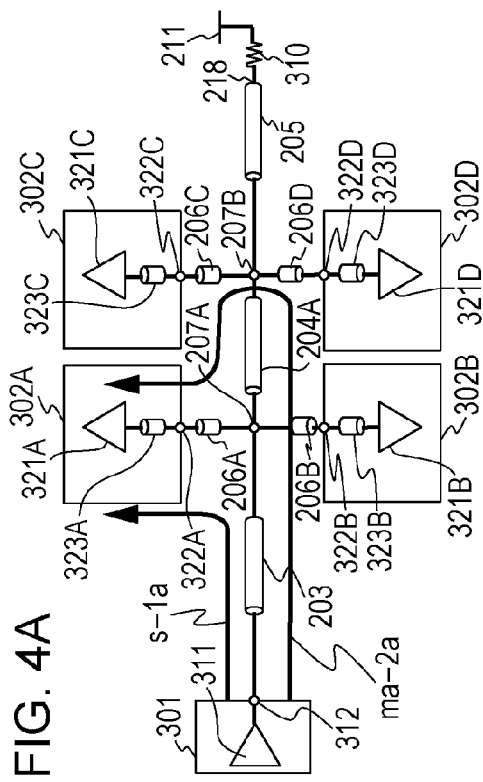

FIG. 4B is a topology diagram for describing a reflection path pa-2a reflecting at the memory cell 321C downstream from the memory cell 321A. The reflection path pa-2a of the signal waves passes through the lines 203, 204A, 206C, and 323C, turns back at the branch connection point 207C by positive reflection, passes through the lines 323C, 206C, 204A, 206A, and 323A, and reaches the memory cell 321A. The memory cells 321A through 231D have high-impedance input as to the lines, so there is positive reflection. Similar positive reflection occurs at the memory cell 321D as well, and reaches the memory cell 321A at the same voltage and the same timing, but this is omitted from illustration.

FIG. 4C is a waveform diagram illustrating individually the voltages of the signal waves transmitted to the memory cell 321A. Description will be made here under the assumption that the characteristic impedance is the same at all lines. A signal wave Ss-1a passes over the signal path s-1a, and exhibits the voltage of the signal wave (direct wave) transmitted to the memory cell 321A. That is to say, the signal wave Ss-1a is a direct wave directly propagating from the start end 217 to the branch line 206A (memory device 302A, i.e., memory cell 321A. Specifically, the signal wave Ss-1a is a signal wave propagating from the start end 217 through the lines 203 and 206A (and line 323A) to the memory device 302 (memory cell 321A).

Signal waves Sma-2a passing over the path ma-2a propagate through the wiring portion 203, decay at the branch connection point 207A, propagate through the line 204A, exhibit negative reflection at the branch connection point 207B, propagate through the line 204A, further decay a the branch connection point 207A, propagate through the branch line 206A and internal line 323A, and reach the memory cell 321A.

That is to say, the signal waves Sma-2a are reflection waves which pass from the start end 217 through the line portions 203 and 204A, and reflect to the branch connection point 207A side at the branch connection point 207B so as to make one round trip on the line 204A, and pass through the branch line 206A to propagate to the memory cell 321A. Accordingly, the signal waves Sma-2a reach the memory device 302A (memory cell 321A), i.e., the branch connection point 207A, with a propagation delay time equivalent to the one round trip on the line 204A, as compared to the signal waves Ss-1a illustrated in FIG. 4C.

The signal waves Spa-2a which pass over the path pa-2a propagate through the line 203, decay at the branch connection point 207A, propagate over the line 204A, decay at the branch connection point 207B, propagate over the lines 206B and 323B, and exhibit positive reflection at the memory cell 321B. The signal waves Spa-2a further propagate over the lines 323B and 206B, decay at the branch connection point 207B, propagate over the line 204A, decay at the branch connection point 207A, propagate over the lines 206A and 323A, and reach the memory cell 321A. Accordingly, the signal waves Spa-2a reach the memory cell 321A (branch connection point 207A) with a propagation delay time as to the signal waves Sma-2a, equivalent to the one round trip on the lines 204A, 206B, and 323B, as compared to the signal waves Ss-1a illustrated in FIG. 4C.

The reflection waves at the memory cell 231D having the same voltage as the signal waves Spa-2a passing over the path pa-2a, and arriving at the same timing, are added to the signal waves Spa-2a, and illustrated as signal waves Spa-2aa indicated by a dotted line. That is to say, the positive reflections from the memory cell 321C and memory cell 321D are represented as signal waves Spa-2aa.

Figure 4D:
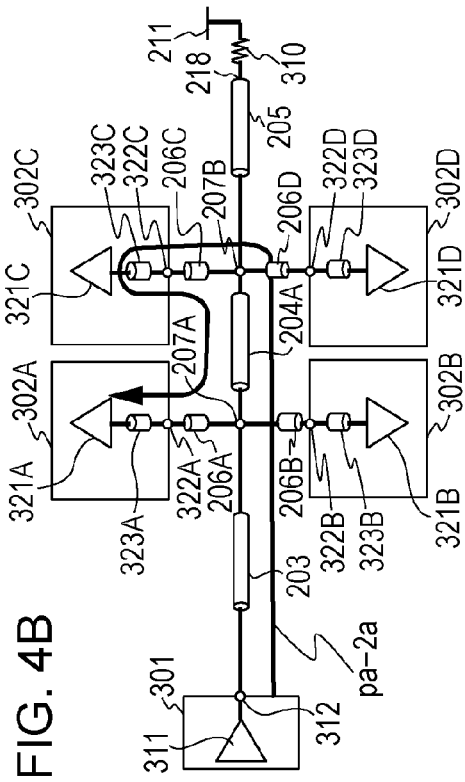

FIG. 4D is a waveform diagram representing the total voltage of all signal waves SS-1a, Sma-2a, and Spa-2a. The waveform of the total signal wave SS1 changes as illustrated in FIG. 4D due to the negative reflection at the branch connection point 207B and the positive reflection at the memory cells 321C and 321D.

While the number of memory cells has been described above as being four, the same mechanism can be applied to an increased load of six or eight, for example. Also, while a case has been described where there are two branch lines from a branch connection point, and one memory cell is provided to each, the same concept can be applied to a case where there is one branch line from the branch connection point, and one memory cell. Further, it has been found that the same concept can be applied to a case where there is one branch line from the branch connection point and multiple memory cells.

Accordingly, the first embodiment employs a technique to generate positive reflection at a timing to cancel out the negative reflection, so as to cancel out the reflection waves due to negative reflection from the branch connection point 207B. That is to say, the wiring portion 203 is divided into a wiring portion 203A and a wiring portion 203B, with the wiring portion 203A having relatively low characteristic impedance, and the wiring portion 203B having relatively high characteristic impedance. Further, the lengths of the wiring portion 203A and the wiring portion 203B were set so as to realize suitable conditions for cancelling out negative reflection.

Figure 5A:
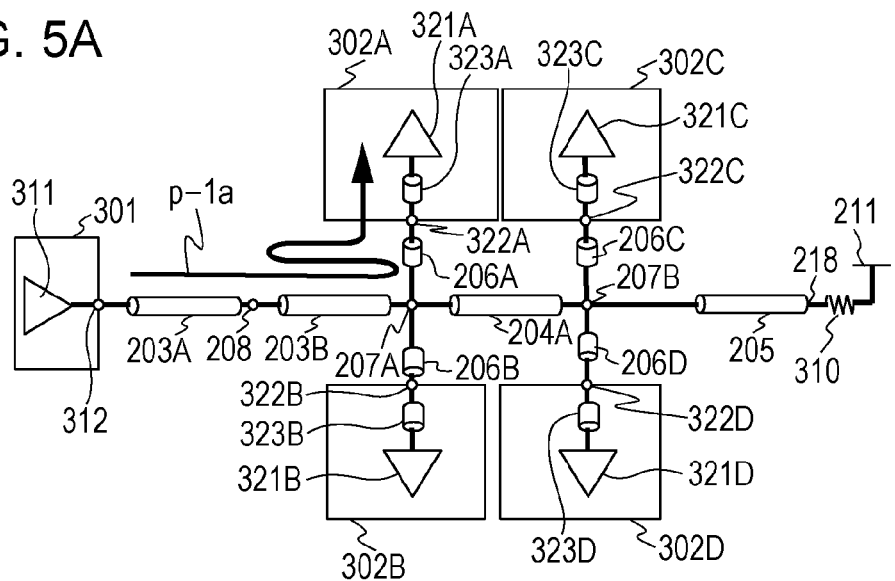
FIGS. 5A through 5C are diagrams for describing waveforms of signals in the memory system according to the first embodiments.
Figure 5B:
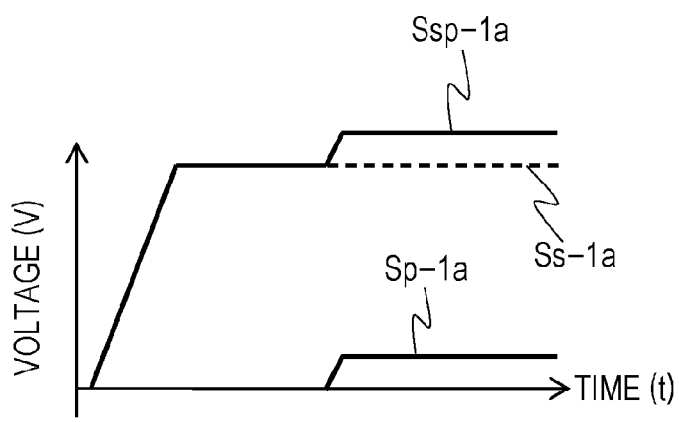
Figure 5C:
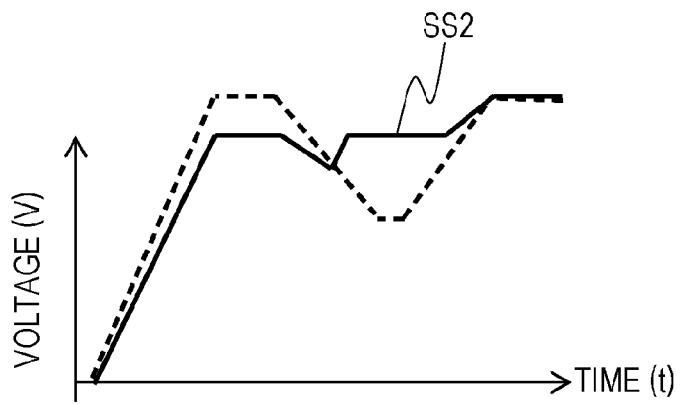

FIGS. 5A through 5C are diagrams for describing waveforms of signals at the memory system 100 according to the first embodiment. FIG. 5A is a topology diagram for describing a path p-1a of reflection waves generated at the wiring portion 203A and the wiring portion 203B. The path p-1a is a path where the signal waves transmitted from the transmission chip 311 of the memory controller 301 pass through the wiring portions 203A and 203B, turn back by negative reflection at the branch connection point 207A, further turn back again by negative reflection at the connection point 208, pass over the wiring portion 203B, over the lines 206A and 323A, and reach the memory cell 321A.

The signal waves which pass over the path p-1a exhibit negative reflection at the branch connection point 207A, and exhibit negative reflection again at the connection point 208, thus becoming positive signals.

That is to say, the signal waves Sp-1a passing over the path p-1a sequentially pass from the start end 217 over the wiring portions 203A and 203B, reflect at the branch connection point 207A toward the connection point 208 side, and further reflect at the connection point 208 toward the branch connection point 207A side. The signal waves Sp-1a are reflection waves which then make one round trip on the wiring portion 203B, and pass over the branch line 206A to propagate at the other end 220A. Accordingly, the signal waves Sp-1a reach the memory device 302A (memory cell 321A), i.e., the branch connection point 207A, with a propagation delay time equivalent to the one round trip on the wiring portion 203B, as compared to the signal waves Ss-1a illustrated in FIG. 4C.

Ringing can be effectively reduced if the delay time of this signal wave Sp-1a can be made to match the timing at which ringing occurs. That is to say, ringing can be effectively reduced if the line length of the wiring portion 203B can be made to be equal or longer than the line length of the wiring portion 204A, but shorter than the total effective branched wiring length obtained by totaling the line length of the wiring portion 204A, the line length of the branch line 206C, and the internal effective line length of the memory device 302C. Note that the positive level of the signal waves Sp-1a is dependent on the line length of the wiring portion 203A. Accordingly, the line length of the wiring portion 203A preferably is equal or longer than the line length of the wiring portion 204A, but shorter than the total effective branched wiring length obtained by totaling the line length of the wiring portion 204A, the line length of the branch line 206C, and the internal effective line length of the memory device 302C.

According to the first embodiment as described above, the characteristic impedance of the wiring portion 203B is set higher than the characteristic impedance of the wiring portion 203A. In other words, the characteristic impedance of the wiring portion 203A is set lower than the characteristic impedance of the wiring portion 203B. This setting generates the signal waves Sp-1a. The signal waves Sp-1a enable the signal waves Sma-2a to be cancelled out, and ringing of signals reaching the memory device 302A (i.e., the memory cell 321A) can be reduced (suppressed).

Further, according to the first embodiment, the line length of the wiring portion 203B is designed to be equal or longer than the line length of the wiring portion 204A, but shorter than the total effective branched wiring length obtained by totaling the line length of the wiring portion 204A, the line length of the branch line 206C, and the internal effective line length of the memory device 302C. Accordingly, the time at which the signal waves Sp-1a and the signal waves Sma-2a reach the memory device 302A (i.e., memory cell 321A) can be matched, and thus ringing of signals can be more effectively reduced. Particularly, the closer the length of the line portion 203B is to the length of the line portion 204A, the more effectively the time at which the signal waves Sp-1a and the signal waves Sma-2a reach the memory device 302A (i.e., memory cell 321A) can be matched.

Further, according to the first embodiment, the line length of the wiring portion 203A is equal or longer than the line length of the wiring portion 204A, but shorter than the total effective branched wiring length obtained by totaling the line length of the wiring portion 204A, the line length of the branch line 206C, and the internal effective line length of the memory device 302C. This allows the absolute values of the positive voltage level reflecting at the connection point 208 toward the branch connection point 207A side and the negative voltage level reflecting at the branch connection point 207B toward the branch connection point 207A side to be brought closer to each other. Accordingly, ringing of signals can be reduced more effectively. Particularly, the closer the length of the line portion 203A is to the length of the line portion 204A, the closer the absolute values of the voltage levels are, so ringing of signals can be reduced more effectively.

That is to say, according to the present embodiment, the negative reflection of signal waves generated at the first branch connection point becomes positive reflection due to characteristic impedance mismatch at the first wiring portion and second wiring portion, and thus can cancel out negative reflection of signal waves generated at the second branch connection point. Consequently, ringing of signals reaching the first reception circuit can be suppressed.

While the first embodiment has been described regarding signals reaching the memory device 302A (memory cell 321A), ringing can be reduced in the same way with signals reaching the memory device 302B (memory cell 321B) as well.

Note that the characteristic impedance at each wiring portion is the average value of characteristic impedance at each position on the wiring portions. The characteristic impedance at each position on the lines can be measured by inputting signals of a predetermined frequency from the viewpoint of the trunk wiring 216 described above, and measuring the reflection waves thereof.

First Example

Figure 6D:
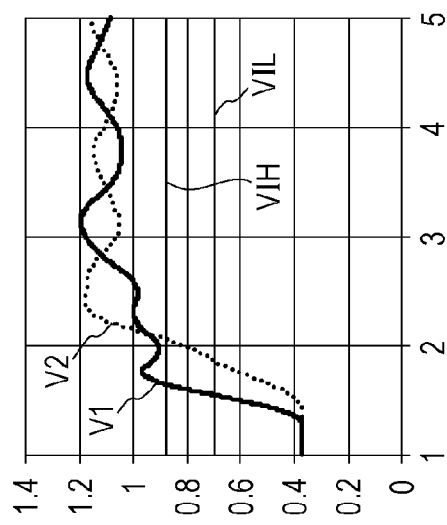
Figure 6E:
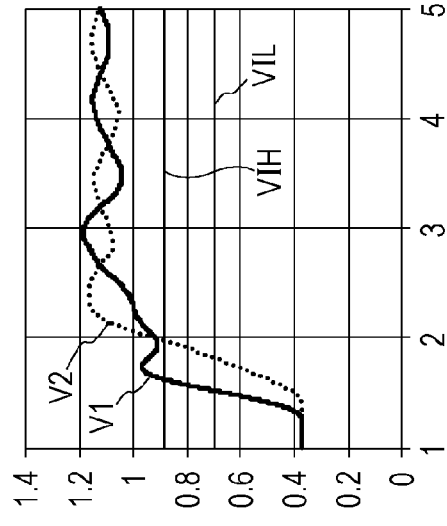
Figure 6F:
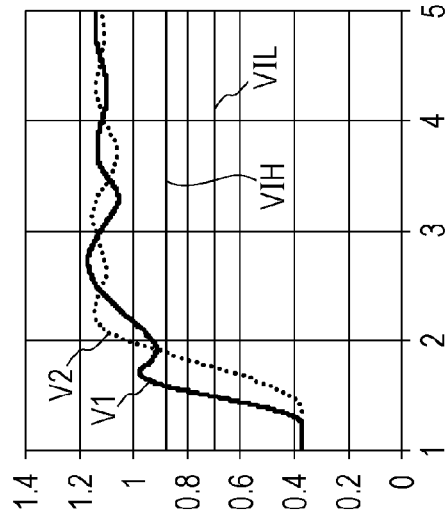

Next, results of having performed simulation with the configuration of the memory system 100 illustrated in FIG. 1 will be described. FIGS. 6D through 6F are waveform diagrams of signals which the memory device 302A of the memory system 100 according to the first embodiment receives, indicating the result of the simulation performed in the wiring configuration illustrated in FIG. 1. The conditions for the simulation were as follows.

The voltage of the signals (pulses) transmitted by the memory controller 301 was 1.5 V, the internal characteristic impedance was 50Ω, and the rise time was 2 V/ns. The memory devices 302A through 302D were approximated by load of 1 pF. The characteristic impedance of wiring other than the wiring portions 203A and 203B was 50Ω, and the delay time was 7 ns/m. The characteristic impedance of the wiring portion 203A was 30Ω, the length was 40 mm, and characteristic impedance of the wiring portion 203B was 60Ω and the length was 40 mm. The length of the line 204A was 20 mm, and the length of the wiring portion 205 was 10 mm. The resistance value of the termination resistance 310 was 50Ω, and the termination potential applied to the termination line 211 was 0.75 V.

Further, simulation was performed under the three conditions of 20 mm, 25 mm, and 30 mm, for the total length of the branch lines 206A through 206D and the effective length within the memory devices 302A through 302D on the motherboard 200. FIG. 6D illustrates a case where the effective branched wiring length was 20 mm, FIG. 6E illustrates a case where the effective branched wiring length was 25 mm, and FIG. 6F illustrates a case where the effective branched wiring length was 30 mm.

In FIGS. 6D through 6F, the voltage of signals which the memory device 302A receives is indicated by V1, and the voltage of signals which the memory device 302C receives is indicated by V2. Note that the waveforms of signals received by the memory devices 302B and 302D are approximately the same as those of the memory devices 302A and 302C, and accordingly description thereof will be omitted here.

As can be seen from FIGS. 6D through 6F, the waveform of signals which the memory cell 321A of the memory device 302A receives (voltage V1) no longer fell below the threshold VIH, thus confirming that ringing of signals was being reduced. Further, the waveform of signals which the memory cell 321C of the memory device 302C receives (voltage V2) no longer fell below the threshold VIH, indicating that signal quality was being secured.

Next, simulation was performed to confirm the effective characteristic impedance conditions for the wiring portions 203A and 203B in the wiring structure illustrated in FIG. 1. The simulation conditions were as follows.

The voltage of the signals (pulses) transmitted by the memory controller 301 was 1.5 V, the internal characteristic impedance was 50Ω, and the rise time was 2 V/ns. The memory devices 302A through 302D were set to 0 pF. The characteristic impedance of wiring other than the wiring portions 203A and 203B was 50Ω, and the delay time was 7 ns/m. The length of the wiring portion 203A was 40 mm, and the length the wiring portion 203B was 40 mm. The length of the line 204A was 20 mm, and the length of the wiring portion 205 was 10 mm. The resistance value of the termination resistance 310 was 50Ω, and the termination potential applied to the termination line 211 was 0.75 V. Moreover, simulation was performed under the conditions that the total wiring length (effective branched wiring length) of the length of the branch lines 206A through 206D and the effective length within the memory devices 302A through 302D on the motherboard 200 was 25 mm.

Under these conditions, the characteristic impedance of the wiring portions 203A and 203B were varied over a range from 20 to 70Ω, and comparison was made between all characteristic impedances and a case of characteristic impedance of 50Ω. The results thereof are illustrated in FIG. 1.

In Table 1, the far left column is the characteristic impedance of the wiring portion 203A, and the top row is the characteristic impedance of the wiring portion 203B. The results illustrated in Table 1 indicate difference in maximum ringing values (mV) under each of the conditions, with positive number indicating improvement in waveforms, and negative numbers indicating no improvement.

TABLE 1

Characteristic Impedance in First Embodiment and Amount of Improvement (mV)

| | | Wiring Portion 203B (Ω) | | | | | | |
|---|---|---|---|---|---|---|---|---|
| | | 20 | 25 | 30 | 40 | 50 | 60 | 70 |
| Wiring Portion 203A (Ω) | 20 | -111 | -60 | -19 | 24 | 18 | 168 | 198 |
| | 25 | -103 | -53 | -12 | 45 | 59 | 38 | 200 |
| | 30 | -103 | -59 | -20 | 38 | 68 | 72 | 90 |
| | 40 | -119 | -81 | -48 | 6 | 35 | 52 | 62 |
| | 50 | -143 | -110 | -81 | -31 | 0 | 17 | 26 |
| | 60 | -169 | -140 | -113 | -70 | -36 | -18 | -10 |
| | 70 | -191 | -170 | -147 | -107 | -74 | -54 | -42 |

It was found from the results of the simulation shown in Table 1 that ringing was reduced in waveforms in the range surrounded by the heavy lines. That is to say, the simulation results in Table 1 show that the characteristic impedance of the wiring portion 203A needs to be set below the characteristic impedance of the wiring portion 204A (50Ω in this case). Under these conditions setting the characteristic impedance of the wiring portion 203B higher than the characteristic impedance of the wiring portion 204A enabled reduced ringing of signal waveforms to be confirmed.

In more detail, it was found that the characteristic impedance of the wiring portion 203A is preferably no lower than 20Ω and no higher than 50Ω, and that the characteristic impedance of the wiring portion 203B is preferably no lower than 40Ω and no higher than 70Ω. At this time, a necessary condition is for the characteristic impedance of the wiring portion 203B to be higher than characteristic impedance of the wiring portion 203A. In other words, a case where the characteristic impedance of the wiring portion 203A is 40Ω and characteristic impedance of the wiring portion 203B is 40Ω, or a case where the characteristic impedance of the wiring portion 203A is 50Ω and characteristic impedance of the wiring portion 203B is 50Ω, are excluded. In order to yield improvement of 10 mV or more, the difference between the characteristic impedance of the wiring portion 203A and the characteristic impedance of the wiring portion 204A preferably is 10Ω or more, and in order to yield improvement of 20 mV or more, preferably is 20Ω or more.

Now, the upper limit of the characteristic impedance of the wiring portion 203A (50Ω) is set as a boundary value where waveform improvement can be expected, since any higher than this and waveform improvement can no longer be expected. On the other hand, the lower limit of the characteristic impedance of the wiring portion 203A (20Ω) is set as a boundary value for signal level tolerance, since any lower than this, the transmittance of the signal waves Ss-1a at the connection point 208 drastically deteriorates.

The reason for the upper limit of the characteristic impedance of the wiring portion 203B (70Ω) is that the transmittance of the signal waves Ss-1a at the branch connection point 207A drastically deteriorates above this, and accordingly is set as a boundary value for signal level tolerance. Conversely, the lower limit value of the characteristic impedance of the wiring portion 203B (40Ω) is set to the boundary value where improvement in waveform can be expected, since any lower than this and waveform improvement can no longer be expected. In order to obtain a large negative reflection amount at the connection point 208 from signals reflected at the branch connection point 207A and transmitted over the wiring portion 203B so as to further the effects of waveform improvement, it is though to be advantageous to set the characteristic impedance of the wiring portion 203A lower than the characteristic impedance of the wiring portion 203B, with a large difference in impedances.

The conditions in the simulation results illustrated in Table 1 where the difference in characteristic impedances is the smallest, is when the characteristic impedance of the wiring portion 203A is 50Ω and the characteristic impedance of the wiring portion 203B is 60Ω. This is 20% in terms of characteristic impedance ratio. Accordingly, the effects of waveform improvement can be furthered under conditions where the characteristic impedance of the wiring portion 203B is larger than the characteristic impedance of the wiring portion 203A by 20%.

Also, the reflection amount of signals transmitted over the wiring portion 203B that are reflected at the connection point 208 at this time is −10%, so the effects of waveform improvement can be furthered under conditions of −10% or lower.

Also, while the characteristic impedance of the third wiring portion and the characteristic impedance of the branched wiring were all defined as being the same at 50Ω in the simulation, the characteristic impedances do not have to be 50Ω and do not have to all be the same, if within a range where the effects of improved reflection and transmission properties can be maintained.

For example, signals transmitted from the wiring portion 203B need to yield a large negative reflection amount at the branch connection point 207A to further the effects of waveform improvement, and it is thought that the composite impedance including the wiring portion 204A be as low as possible as to the wiring portion 203B.

The smallest negative reflection amount in the simulation results shown in Table 1 is the case where the characteristic impedance of the second wiring portion is 40Ω. The conditions in this case are that the characteristic impedance of the third wiring portion is 125% of the characteristic impedance of the second wiring portion. Accordingly, the effects of waveform improvement can be furthered in a case where the characteristic impedance of the third wiring portion is 125% or less than the characteristic impedance of the second wiring portion. For example, in a case where the characteristic impedance of the line for the wiring portion 203B is 70Ω, 125% of this is approximately 85Ω. The reflection amount of signals transmitted over the wiring portion 203B at the connection point 208 at this time is approximately −41%, so the effects of waveform improvement can be furthered if −41% or lower. Setting the characteristic impedances of the wiring portions 203A and 203B to the above ranges effectively improved ringing in the waveforms.

Figure 7:
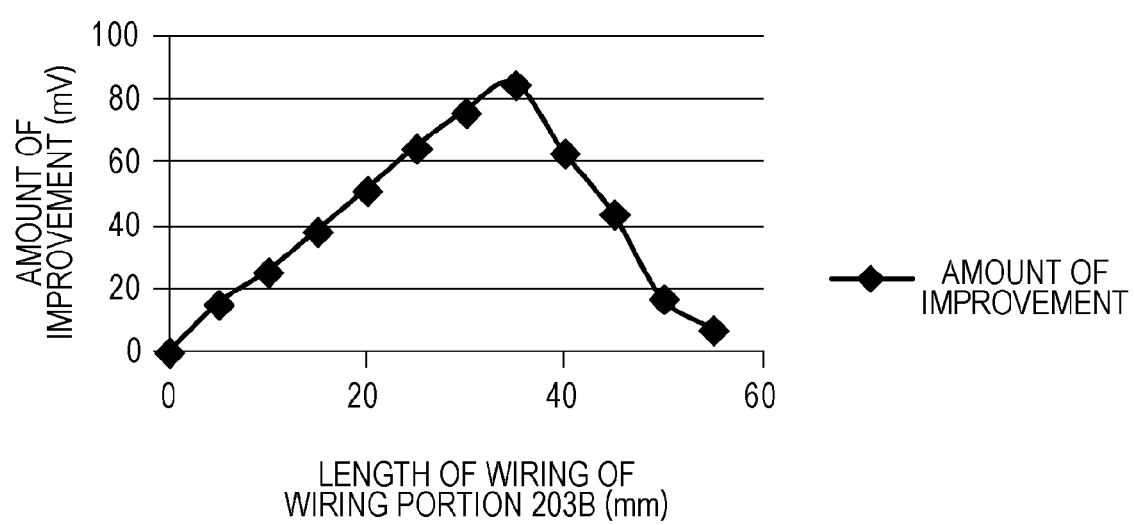
FIG. 7 is a graph illustrating the amount of improvement in signal voltage with regard to wiring length of a second wiring portion.

The results of simulation performed to confirm the conditions for the length of the wiring portions 203A and 203B in the wiring structure in FIG. 1 are illustrated in FIG. 7. FIG. 7 is a graph illustrating the amount of improvement in signal voltage as to the length of the wiring portion 203B. The conditions used to confirm effective conditions for the length of the wiring portions 203A and 203B were as follows.

The characteristic impedance of the wiring portion 203A was set to 30Ω, the length to 50 mm, characteristic impedance of the wiring portion 203B was set to 60Ω, and other than that the conditions were the same as the characteristic impedance described above. That is to say, the characteristic impedance of the wiring portion 204A was set to 50Ω, the length to 20 mm, and the total length (effective branched wiring length) of the length of the second branched wiring 206B and the internal effective line length of the memory device 302B to 25 mm. Under these conditions, the length of the wiring portion 203B was varied between 0 to 55 mm at 5 mm intervals, and compared with a case where the wiring portion 203B was 0 mm.

The results illustrated in FIG. 7 indicate improved waveform if the value is positive, and no improvement if negative, in the same way as with Table 1. The results of the simulation shown in FIG. 7 indicate that ringing of waveform was reduced (improvement of 40 mV or more) in a case where the wiring portion 203B is equivalent or longer than the length of the wiring portion 204A and shorter than the length where the effective branched wiring length is added to the length of the wiring portion 204A, which is 20 to 45 mm. In a case where the length of the wiring portion 203B is longer than the wiring portion 204A by an amount of 10 mm or more, but shorter than the a length obtained by adding the effective branched wiring length to the length of the wiring portion 204A, the amount of improvement regarding ringing is 60 mV or more, which is an even more preferably arrangement.

Second Embodiment

Figure 8:
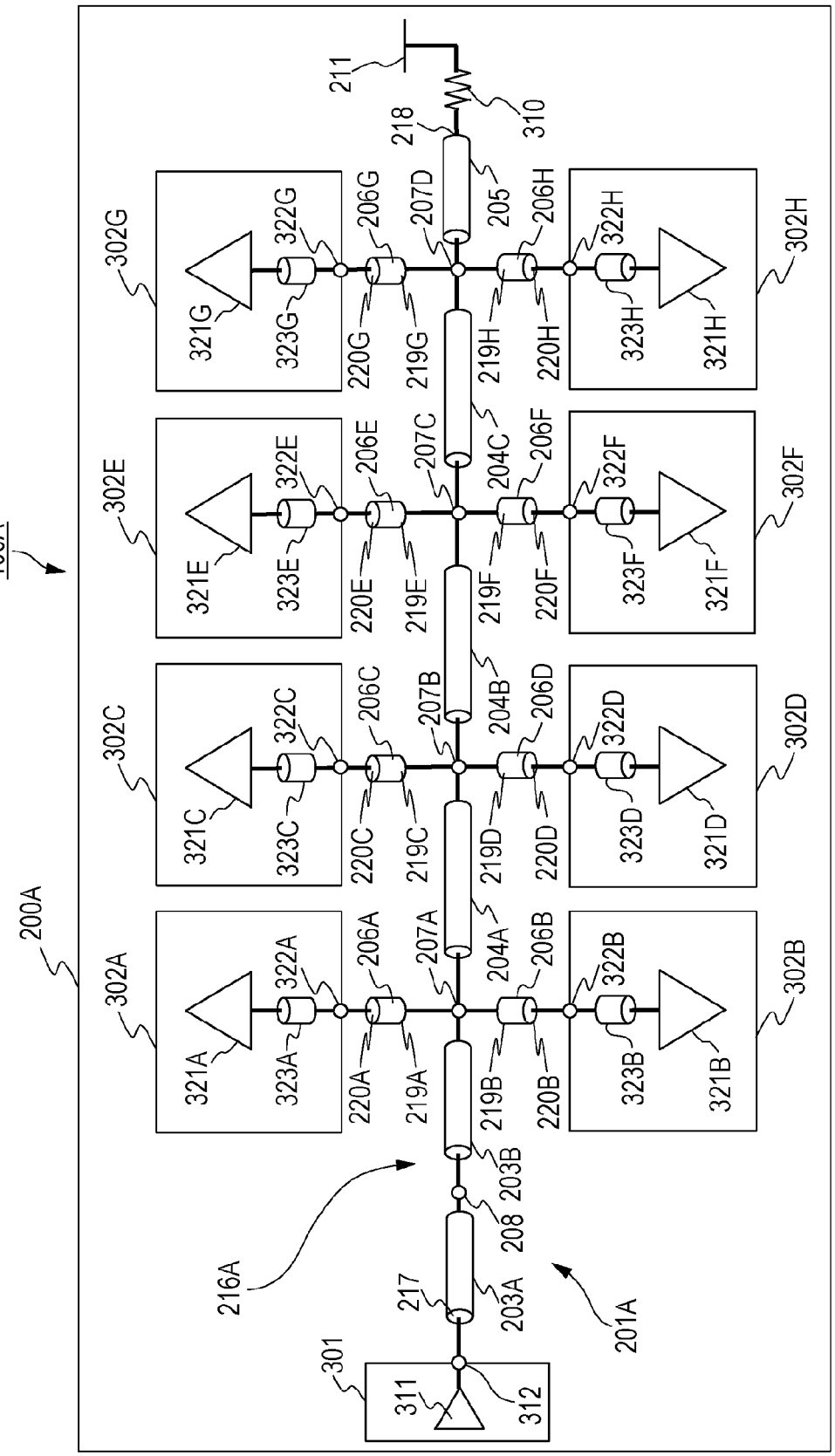
FIG. 8 is a topology diagram illustrating a wiring configuration of a memory system, as an example of a printed circuit board according to a second embodiment.

Next, a printed circuit board according to a second embodiment of the present invention will be described. FIG. 8 is a topology diagram illustrating the wiring configuration of a memory system as an example of the printed circuit board according to the second embodiment. Configurations in the second embodiment which are the same as those in the first embodiment will be denoted with the same reference numerals, and description thereof will be omitted.

A memory system 100A which is a printed circuit board has a motherboard 200A which is a printed wiring board, a memory controller 301 which is a transmission circuit, and multiple memory devices 302A through 302H, which are multiple reception circuits. The memory devices 302A through 302H in the second embodiment are DDR3-SDRAMs. The memory controller 301 and the multiple memory devices 302A through 302H are mounted on the motherboard 200A. Specifically, the memory controller 301 is mounted on one of the front face and rear face of the motherboard 200A. The memory devices 302A, 302C, 302E, and 302G, are mounted on the front face, while the memory devices 302B, 302D, 302F, and 302H, are mounted on the rear face.

The memory controller 301 controls the memory devices 302A through 302H. The memory controller 301 transmits address/command signals to the memory devices 302A through 302H through the motherboard 200A.

The memory devices 302A through 302H receive the address/command signals transmitted from the memory controller 301 via the motherboard 200A. The memory controller 301 and the memory devices 302A through 302H exchange data signals.

The memory devices 302A through 302H are semiconductor packages including memory cells 321A through 321H made up of semiconductor chips which are reception elements, and reception terminals 322A through 322H connected to the memory cells 321A through 321H via internal wiring 323A through 323H. Note that the internal wiring 323A through 323H is effective wiring of the memory devices 302A through 302H.

The bus line for address signals and the bus line for command signals in the second embodiment are fly-by wiring structures, with one bus line 201A of the multiple bus lines being illustrated in FIG. 8.

The motherboard 200A has the bus line 201A connecting the memory controller 301 (transmission element) and the memory devices 302A through 302H (reception elements) by fly-by routing.

The bus line 201A has the start end 217 electrically connected to the transmission terminal 312 of the memory controller 301, and a trunk wiring 216A where the termination 218 is electrically connected to one end of a termination resistance (terminator) 310. The other end of the termination resistance 310 is electrically connected to the termination line 211 where termination potential is applied. Accordingly, the start end 217 of the trunk wiring 216A is electrically connected to the memory controller 301, and the termination 218 is electrically connected to the termination resistance (terminator) 310, so reflection of signals at the termination 218 is suppressed by the termination resistance 310.

The bus line 201A also has branch lines 206A through 206H which electrically connect reception terminals 322A through 322H of the memory devices 302A through 302H to branch connection points 207A through 207D on the trunk wiring 216. To describe this in detail, one end 219E and 219F of the branch lines 206E and 206F are electrically connected to the branch connection point 207C, and one end 219G and 219H of the branch lines 206G and 206H are electrically connected to the branch connection point 207D. Also, the other ends 220A through 220H of the branch lines 206A through 206H are electrically connected to reception terminals 322A through 322H of the memory devices 302A through 302H.

In the second embodiment, the memory devices 302E and 302F are third reception circuits, and the memory devices 302G and 302H are fourth reception circuits. While description will be made in the second embodiment regarding a case where the memory devices 302A through 302H are each one, the number thereof may be multiple.

The branch connection point 207C is a third branch connection point that is farther from the start end 217 of the trunk wiring 216 than the branch connection point 207B. The branch connection point 207D is a fourth branch connection point that is farther from the start end 217 of the trunk wiring 216 than the branch connection point 207C. The branch lines 206E and 206F are third branch lines, and the branch lines 206G and 206H are fourth branch lines. The branch lines 206A through 206H are set to have the same line length (length in the line direction).

The trunk wiring 216A has the wiring portion 203A between the start end 217 and the connection point 208, the wiring portion 203B between the connection point 208 and the branch connection point 207A, and the wiring portion 204A between the branch connection point 207A and the branch connection point 207B. The trunk wiring 216A also has the wiring portion 204B between the branch connection point 207B and the branch connection point 207C, the wiring portion 204C between the branch connection point 207C and the branch connection point 207D, and the wiring portion 205 between the branch connection point 207D and the termination 218.

The trunk wiring 216A according to the second embodiment is formed at the inner layer or the front/rear layers of the motherboard 200A. The branch lines 206A, 206C, 206E, and 206G on the front layer side are formed straddling the inner layer and front layer of the motherboard 200A. The branch lines 206B, 206D, 206F, and 206H on the rear layer side are formed straddling the inner layer and rear layer of the motherboard 200A. The memory devices 302A through 302H are BGA semiconductor packages, with the memory devices 302A, 302C, 302E, and 302G mounted on the front layer of the motherboard 200A and the memory devices 302B, 302D, 302F, and 302H mounted on the rear layer of the motherboard 200A.

Thus, according to the second embodiment, the memory system 100A has the memory devices 302E, 302F, 302G, and 302H, in addition to the memory devices 302A, 302B, 302C, and 302D. Even with the memory devices 302E through 302H added, negative reflection can be cancelled out at the branch connection point 207B in the same way as with the first embodiment, and thus ringing of signals received by the memory devices 302A and 302B can be suppressed.

Third Embodiment

Figure 9:
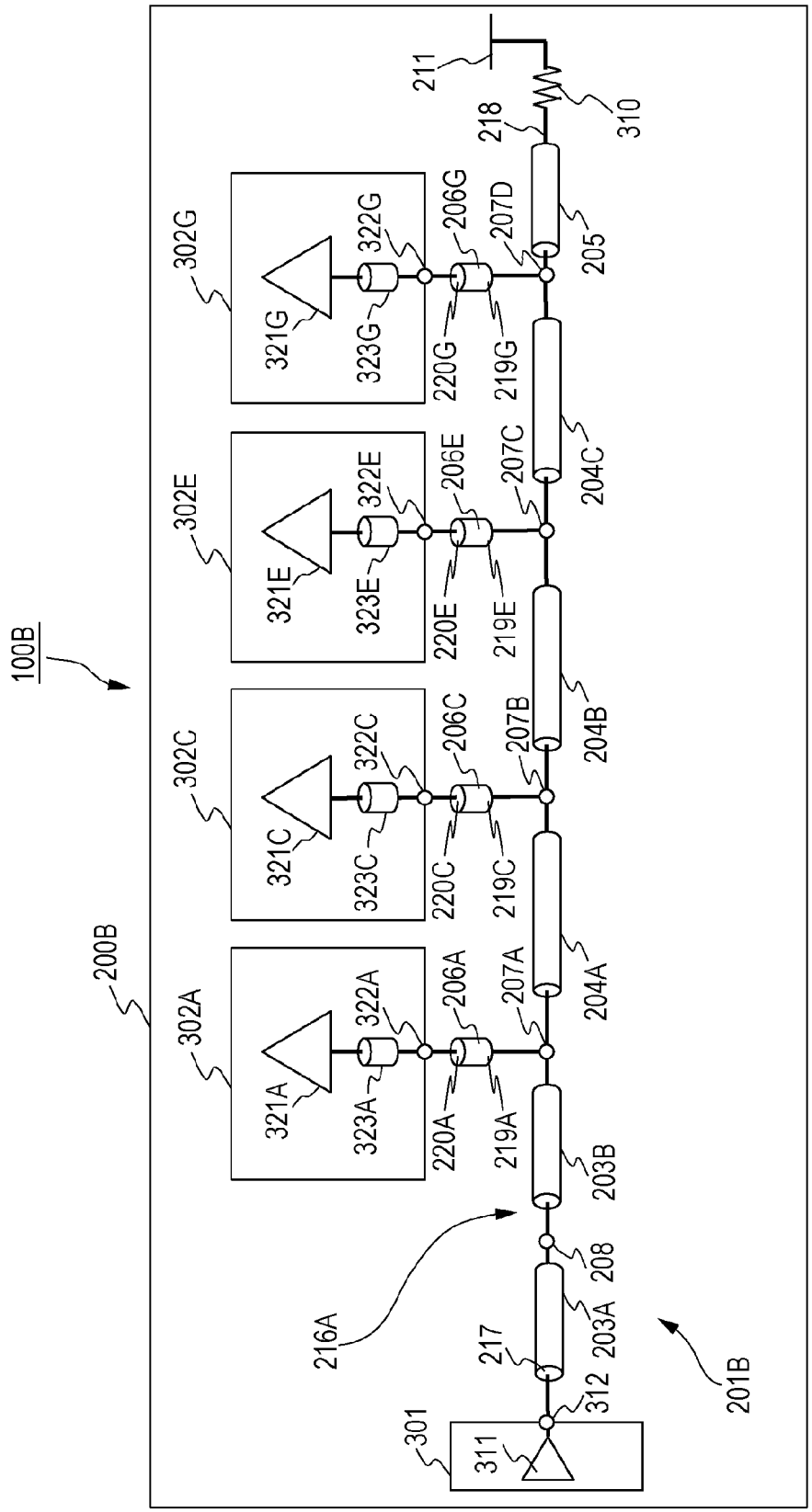
FIG. 9 is a topology diagram illustrating a wiring configuration of a memory system, as an example of a printed circuit board according to a third embodiment.

Next, FIG. 9 is a topology diagram illustrating the wiring configuration of a memory system 100B as an example of a printed circuit board according to a third embodiment. Configurations in the third embodiment which are the same as those in the above embodiments will be denoted with the same reference numerals, and description thereof will be omitted.

The memory system 100B is the memory system 100A in FIG. 8 from which the memory devices 302B, 302D, 302F, and 302H have been omitted, and otherwise is the same configuration as the memory system 100A.

That is to say, the configuration of a bus line 201B of the memory system 100B has a different motherboard 200B than the bus line 201A according to the second embodiment described above. Note that the bus line 201B has the trunk wiring 216A described in the second embodiment, with the configuration of the branched lines 206B, 206D, 206F, and 206H branching from the branch connection points on the trunk wiring having been omitted.

Thus, ringing of signals received by the memory device 302A can be suppressed with this configuration as well, in the same way as with the second embodiment described above.

Second Example

Next, results will be described of having performed simulation comparing the wiring structure according to FIGS. 8 and 9 described in the second and third embodiments, and a comparative example where the wiring portions 203A and 203B in FIGS. 8 and 9 are set to the same characteristic impedance.

First, the conditions regarding the wiring structure in FIGS. 8 and 9 were as follows. The characteristic impedance of the wiring portion 203A was set to 30Ω, and the characteristic impedance of the wiring portion 203B was set to 60Ω.

Next, as a comparative example, the conditions regarding the wiring structure in FIGS. 8 and 9 where the characteristic impedance was set to be the same for the wiring portions 203A and 203B were as follows. The characteristic impedance of the wiring portions 203A and 203B was set to 50Ω.

Of the confirmed conditions, the common conditions were as follows. The voltage of the signals (pulses) transmitted by the memory controller 301 was 1.5 V, the internal characteristic impedance was 50Ω, the rise time was 2 V/ns, and the memory devices 302A through 302H were set to 0 pF. The characteristic impedance of wiring other than the wiring portions 203A and 203B was 50Ω, and the delay time was 7 ns/m. The line length of the wiring portion 203A was 40 mm, and line length of the wiring portion 203B was 40 mm. The lengths of the wiring portions 204A, 204B, and 204C were each 20 mm, and the length of the wiring portion 205 was 10 mm. The resistance value of the termination resistance 310 was 50Ω, and the termination potential applied to the termination line 211 was 0.75 V. Further, the simulation was performed under the conditions that the total line length of the length of the branched lines 206A through 206H and effective internal line length of the memory devices 302A through 302H (effective branched wiring length) was 20 mm.

FIGS. 10A through 10D are waveform diagrams illustrating signals which the memory devices in the memory system according to the second embodiment and the comparative example illustrate. FIGS. 10A through 10D show signal voltage V31 at the memory device 302A, voltage V32 at the memory device 302C, voltage V33 at the memory device 302E, and voltage V34 at the memory device 302G. The memory devices 302B, 302D, 302F, and 302H have the same waveforms as the memory devices 302A, 302C, 302E, and 302G, so illustration is omitted here.

Figure 10A:
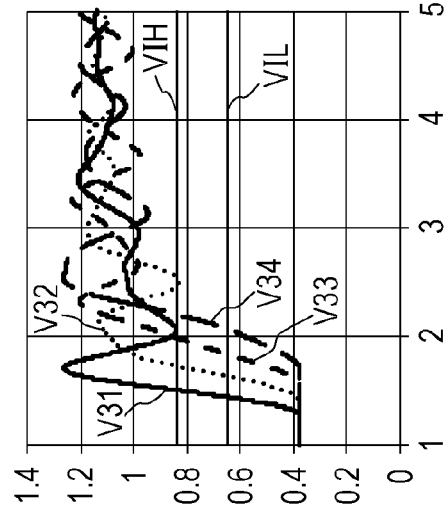
FIGS. 10A through 10D are waveform diagrams illustrating signals which memory devices receive in memory systems according to a second example and a comparative example.
Figure 10B:
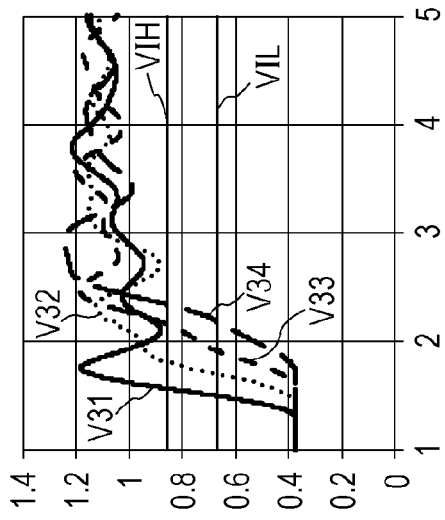

FIG. 10A is a waveform diagram of the comparative example, where the wiring portions 203A and 203B are made to be the same characteristic impedance in the wiring structure illustrated in FIG. 8. FIG. 10B is a waveform diagram of the embodiment, where the wiring portions 203A and 203B are made to have different characteristic impedances in the wiring structure illustrated in FIG. 8. It was confirmed from the results in FIGS. 10A and 10B that the ringing in FIG. 10B is suppressed as compared to FIG. 10A.

Figure 10C:
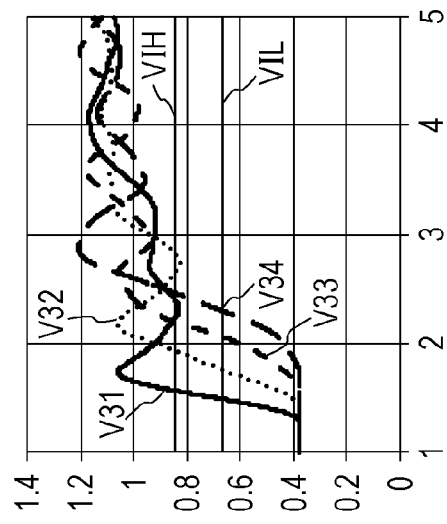
Figure 10D:
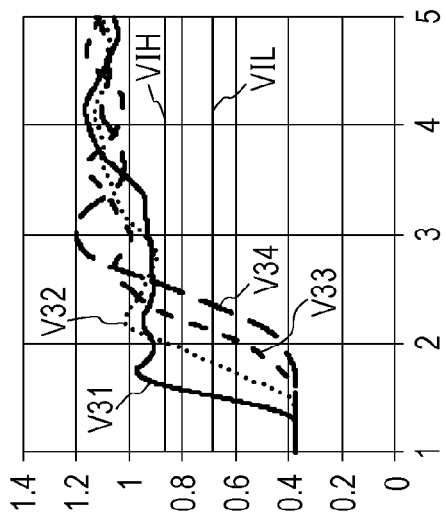

FIG. 10C is a waveform diagram of the comparative example, where the wiring portions 203A and 203B are made to be the same characteristic impedance in the wiring structure illustrated in FIG. 9. FIG. 10D is a waveform diagram of the embodiment, where the wiring portions 203A and 203B are made to have different characteristic impedances in the wiring structure illustrated in FIG. 9. It was confirmed from the results in FIGS. 10A and 10B that the ringing in FIG. 10D is suppressed as compared to FIG. 10C.

Accordingly, it was confirmed that, in the configurations in FIGS. 8 and 9 as well, ringing of the signals received by the memory device 302A (memory device 302B) was reduced.

Figure 11:
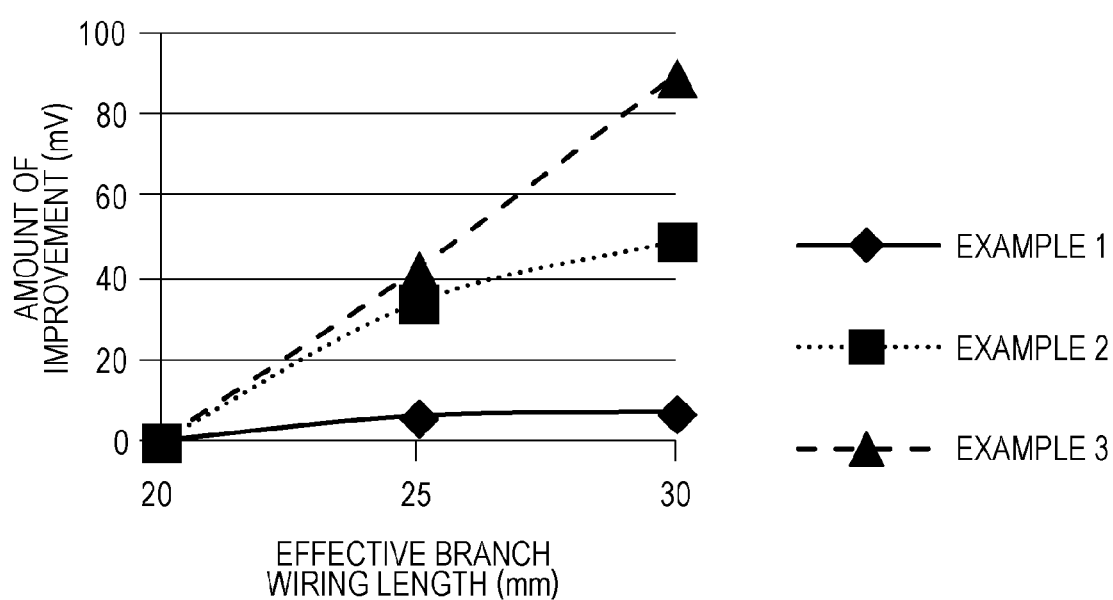
FIG. 11 is a graph illustrating the amount of improvement regarding ringing as to effective branched wiring length in the second example.

FIG. 11 illustrates the results of confirming the amount of improvement regarding ringing, based on difference in effective branched wiring length, totaling the branched wiring 206 and the effective internal wiring 323 of the memory devices 302 in the wiring structures in FIGS. 1, 8, and 9. FIG. 11 is a graph illustrating the amount of improvement regarding ringing, according to the effective branched wiring length. In FIG. 11, the wiring configuration in FIG. 1 is shown as Example 1, the wiring configuration in FIG. 8 as Example 2, and the wiring configuration in FIG. 9 as Example 3.

The common conditions for confirming the wiring structures according to FIGS. 1, 8, and 9 that are effective, were as follows. The voltage of the signals (pulses) transmitted by the memory controller 301 was 1.5 V, the internal characteristic impedance was 50Ω, and the rise time was 2 V/ns. The memory devices 302A through 302H were approximated by load of 0 pF. The characteristic impedance of wiring other than the wiring portions 203A and 203B was 50Ω, and the delay time was 7 ns/m. The characteristic impedance of the wiring portion 203A was 30Ω, the length was 40 mm, and characteristic impedance of the wiring portion 203B was 60Ω and the length was 40 mm. The length of the line 204A was 20 mm, and the length of the wiring portion 205 was 10 mm. The resistance value of the termination resistance 310 was 50Ω, and the termination potential applied to the termination line 211 was 0.75 V.

Simulation was performed under the three conditions of 20 mm, 25 mm, and 30 mm, for the total length of the branch lines 206A through 206D and the effective length within the memory devices 302A through 302D (effective branched wiring length).

From the simulation results in FIG. 11, it was confirmed that the longer the effective branched wiring length at the branched wring including the internal wiring the of the memory devices 302 is, the more ringing is reduced. That is to say, the effective branched wiring length in the branch line 206A and the effective branched wiring length in the branch line 206C are longer than the wiring portion 204A. Accordingly, the reduction in the ringing of signals which the memory device 302A (memory device 302B) receives is great, and ringing is suppressed more effectively.

General methods to adjust characteristic impedance include changing the width if lines on the printed wiring board, and placing ground (GND) lines nearby. For example, widening the lines, and situating GND lines nearby, enable the characteristic impedance of the wiring to be reduced. Also, changing the design for characteristic impedance of the wiring in each wiring layer enables the characteristic impedance to be changed by changing the wiring layer. Special methods include locally removing solid GND portions serving as a reference, forming these portions in a mesh, locally changing the thickness of insulation or dielectric constant, or the like.

Note that the present invention is not restricted to the above-described embodiments, and that many modifications may be made within the technical concept of the present invention.

Description has been made in the above embodiments regarding a case where the printed circuit board is a memory system and the printed wiring board is a motherboard where memory devices and a memory controller are mounted, but this arrangement is not restrictive. The printed circuit board may be a module board serving as a printed wiring board, and a memory module (DIMM) configured as a memory device mounted to the module board. In this case, the memory controller is mounted to the motherboard, and the memory controller and the memory devices are electrically connected by connecting the memory module to the motherboard using a connector or the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-082814, filed Apr. 14, 2014, which is hereby incorporated by reference herein in its entirety.

What is claimed is:

1. A printed circuit board comprising:
    a printed wiring board; and
    a first reception circuit and a second reception circuit, mounted on the printed wiring board, that receive signals transmitted from a transmission circuit via wiring of the printed wiring board,
    the printed wiring board having formed thereupon
        a trunk wiring, of which a start end is electrically connected to the transmission circuit,
        a first branched line of which one end is electrically connected to a first branch connection point on the trunk wiring, and the other end is electrically connected to the first reception circuit, and
        a second branched line of which one end is electrically connected to a second branch connection point on the trunk wiring that is farther from the start end than the first branch connection point, and the other end is electrically connected to the second reception circuit,
    wherein a wiring area between the start end and the first branch connection point of the trunk wiring is divided into a first wiring portion and a second wiring portion, in order from the start end, a wiring area between the first branch connection point and the second branch connection point is a third wiring portion, the characteristic impedance of the first wiring portion is set to equal or lower than the characteristic impedance of the third wiring portion, and the characteristic impedance of the second wiring portion is set higher than the characteristic impedance of the first wiring portion, and
    wherein the length of the second wiring portion is equal to or longer than the length of the third wiring portion, but shorter than the total length of the length of the third wiring portion, the length of the second branched line, and the effective line length within the second reception circuit.

2. The printed circuit board according to claim 1, wherein the length of the second wiring portion is longer than the third wiring portion by 10 mm or more, and shorter than the total length of the length of the third wiring portion, the length of the second branched line, and the effective line length within the second reception circuit, by 10 mm or more.

3. The printed circuit board according to claim 1, wherein the length of the first wiring portion is equal to or longer than the length of the third wiring portion, but shorter than the total length of the length of the third wiring portion, the length of the second branched line, and the effective line length within the second reception circuit.

4. The printed circuit board according to claim 1, wherein a characteristic impedance of the second wiring portion is higher than a characteristic impedance of the first wiring portion, the characteristic impedance of the first wiring portion is 20Ω or more but 50Ω or less, and the characteristic impedance of the second wiring portion is 40Ω or more but 70Ω or less.

5. The printed circuit board according to claim 4, wherein difference between the characteristic impedance of the first wiring portion and the characteristic impedance of the second wiring portion is 10Ω or more.

6. The printed circuit board according to claim 1, wherein the wiring length obtained by totaling the length of the first branched line and the effective line length within the first reception circuit, and the wiring length obtained by totaling the length of the second branched line and the effective line length within the second reception circuit, are longer than the length of the third wiring portion.

7. The printed circuit board according to claim 1, wherein a plurality of the first reception circuit and a plurality of the second reception circuit are provided.

8. The printed circuit board according to claim 1, wherein the transmission circuit is mounted on the printed wiring board.

9. The printed circuit board according to claim 1, wherein the first reception circuit and the second reception circuit are memory devices, and wherein the transmission circuit is a memory controller that controls the memory devices.

10. The printed circuit board according to claim 7, wherein the memory devices are DDR3-SDRAMs.

11. The printed circuit board according to claim 1, wherein the first branched line and the second branched line are formed straddling the inner layer and the front layer of the printed circuit board.

12. An electronic device comprising the printed circuit board according to claim 1.

13. A printed wiring board comprising:
a trunk wiring, of which a start end is electrically connected to a transmission circuit;
a first branched line of which one end is electrically connected to a first branch connection point on the trunk wiring, and the other end is electrically connected to a first reception circuit; and
a second branched line of which one end is electrically connected to a second branch connection point on the trunk wiring that is farther from the start end than the first branch connection point, and the other end is electrically connected to a second reception circuit,
wherein a wiring area between the start end and the first branch connection point of the trunk wiring is divided into a first wiring portion and a second wiring portion, in order from the start end, a wiring area between the first branch connection point and the second branch connection point is a third wiring portion, the characteristic impedance of the first wiring portion is set to equal or lower than the characteristic impedance of the third wiring portion, and the characteristic impedance of the second wiring portion is set higher than the characteristic impedance of the first wiring portion, and
wherein the length of the second wiring portion is equal to or longer than the length of the third wiring portion, but shorter than the total length of the length of the third wiring portion, the length of the second branched line, and the effective line length within the second reception circuit.

14. The printed wiring board according to claim 13, wherein the length of the second wiring portion is longer than the third wiring portion by 10 mm or more, and shorter than the total length of the length of the third wiring portion, the length of the second branched line, and the effective line length within the second reception circuit, by 10 mm or more.

15. The printed wiring board according to claim 13, wherein the length of the first wiring portion is equal to or longer than the length of the third wiring portion, but shorter than the total length of the length of the third wiring portion, the length of the second branched line, and the effective line length within the second reception circuit.

16. The printed wiring board according to claim 13, wherein a characteristic impedance of the second wiring portion is higher than a characteristic impedance of the first wiring portion, the characteristic impedance of the first wiring portion is 20Ω or more but 50Ω or less, and the characteristic impedance of the second wiring portion is 40Ω or more but 70Ω or less.

17. The printed wiring board according to claim 16, wherein difference between the characteristic impedance of the first wiring portion and the characteristic impedance of the second wiring portion is 10Ω or more.

18. The printed wiring board according to claim 13, wherein the wiring length obtained by totaling the length of the first branched line and the effective line length within the first reception circuit, and the wiring length obtained by totaling the length of the second branched line and the effective line length within the second reception circuit, are longer than the length of the third wiring portion.

* * * * *